(12) United States Patent
Liu (10) Patent No.: US 7,622,992 B2
(45) Date of Patent: Nov. 24, 2009

(54) POWER AMPLIFIER CIRCUIT HAVING A BIAS SIGNAL INPUTTED INTO INPUT TERMINAL AND METHOD THEREOF

(75) Inventor: Ren-Chieh Liu, Chang-Hua Hsien (TW)

(73) Assignee: Realtek Semiconductor Corp., HsinChu (TW)

( * ) Notice: Subject to any disclaimer, the term of this patent is extended or adjusted under 35 U.S.C. 154(b) by 93 days.

(21) Appl. No.: 11/834,632

(22) Filed: Aug. 6, 2007

(65) Prior Publication Data
US 2008/0036534 A1 Feb. 14, 2008

(30) Foreign Application Priority Data
Aug. 14, 2006 (TW) ............................... 95129780 A (51) Int. Cl.
*H03G 3/30* (2006.01)
(52) U.S. Cl. ...................................... 330/285; 330/136
(58) Field of Classification Search ................. 330/136, 330/140, 285
See application file for complete search history.

(56) References Cited

U.S. PATENT DOCUMENTS

| | | | |
|---|---|---|---|
| 4,591,803 A | 5/1986 | Saleh | |
| 5,017,885 A | 5/1991 | Saleh | |
| 5,422,598 A | 6/1995 | Maeda | |
| 5,426,641 A | 6/1995 | Afrashteh | |
| 5,655,220 A | 8/1997 | Weiland | |
| 5,675,288 A | 10/1997 | Peyrotte | |
| 5,815,038 A | 9/1998 | Ogura | |
| 5,832,373 A | 11/1998 | Nakanishi | |
| 5,933,767 A | 8/1999 | Leizerovich | |
| 6,028,477 A | 2/2000 | Gentzler | |
| 6,043,707 A | 3/2000 | Budnik | |
| 6,043,712 A | 3/2000 | Leizerovich | |
| 6,097,252 A * | 8/2000 | Sigmon et al. | 330/136 |
| 6,107,880 A | 8/2000 | Shaw | |
| 6,141,541 A | 10/2000 | Midya | |
| 6,353,360 B1 | 3/2002 | Hau | |
| 6,417,729 B1 | 7/2002 | Lemay | |
| 6,545,536 B1 | 4/2003 | Haczewski | |
| 6,556,084 B2 | 4/2003 | Sowlati | |
| 6,639,466 B2 * | 10/2003 | Johnson | 330/149 |
| 6,650,181 B2 * | 11/2003 | Shinjo et al. | 330/136 |
| 6,788,151 B2 | 9/2004 | Shvarts | |
| 6,819,184 B2 | 11/2004 | Pengelly | |
| 6,844,776 B2 | 1/2005 | Schell | |
| 6,882,227 B2 | 4/2005 | Barry | |
| 6,917,243 B2 | 7/2005 | Doherty | |
| 6,917,244 B2 | 7/2005 | Rosnell | |
| 6,920,334 B1 | 7/2005 | Karsi | |
| 6,922,107 B1 | 7/2005 | Green | |
| 7,358,807 B2 * | 4/2008 | Scuderi et al. | 330/140 |

\* cited by examiner

*Primary Examiner*—Steven J Mottola
(74) *Attorney, Agent, or Firm*—Winston Hsu (57) ABSTRACT

The present invention discloses an adjustable gain power amplifier circuit. The adjustable gain power amplifier circuit includes a power amplifying unit for receiving and amplifying an input signal to generate an output signal; a power detecting unit for detecting power of the input signal to generate a detecting signal; and a biasing control unit for generating a biasing signal according to the detecting signal and to output the biasing signal.

14 Claims, 6 Drawing Sheets

POWER AMPLIFIER CIRCUIT HAVING A BIAS SIGNAL INPUTTED INTO INPUT TERMINAL AND METHOD THEREOF

BACKGROUND OF THE INVENTION

1. Field of the Invention

The present invention is related to a power amplifying circuit, and more particularly to a power amplifying circuit having a biasing signal at the input terminal, and an amplifying method thereof.

2. Description of the Prior Art

In modern wireless communication systems, power amplifying units are utilized for amplifying an output signal to a reasonable amplitude. Thus, the power amplifying units are the most power consuming devices in wireless communication systems. An ideal power amplifying unit is capable of adaptively adjusting the output power according to requirements to reduce the power consumption of the system. According to a prior art method, power efficiency is increased by adjusting the power source of the power amplifying unit to adjust the output power of the power amplifying unit. Therefore, if high output power is required, the power source of the power amplifying unit will be increased; and if low output power is required, then the power source of the power amplifying unit will be decreased.

SUMMARY OF THE INVENTION

Therefore, one of the objectives of the present invention is to provide a power amplifying circuit having a biasing signal at the input terminal, and an amplifying method thereof, which is able to adaptively adjust the biasing voltage of the power amplifying circuit, and change the gain or supply current in different output powers of the power amplifying circuit to thereby increase the output power and the power efficiency.

According to an embodiment of the present invention, an adjustable gain power amplifier circuit is disclosed. The adjustable gain power amplifier circuit comprises a power amplifying unit, a power detecting unit, and a biasing control unit. The power amplifying unit is utilized for receiving an input signal and amplifying the input signal to generate an output signal; the power detecting unit is utilized for detecting power of the input signal to generate a detecting signal; and the biasing control unit is utilized for generating a biasing signal according to the detecting signal, and outputting the biasing signal.

According to another embodiment of the present invention, an adjustable gain power amplifier circuit is disclosed. The adjustable gain power amplifier circuit comprises a power amplifying unit, an envelope detector, and a biasing control unit. The power amplifying unit is utilized for receiving an input signal and amplifying the input signal to generate an output signal; the envelope detector is utilized for detecting an envelope of the input signal to generate a detecting signal; and the biasing control unit is utilized for generating a biasing signal according to the detecting signal, and outputting the biasing signal.

According to another embodiment of the present invention, a method for adjusting gain of a power amplifier is disclosed, wherein the power amplifier receives an input signal and amplifies the input signal to generate an output signal. The method comprises: detecting power of the input signal to generate a detecting signal; generating a biasing signal according to the detecting signal, and outputting the biasing signal; and adjusting gain of the power amplifier according to the biasing signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
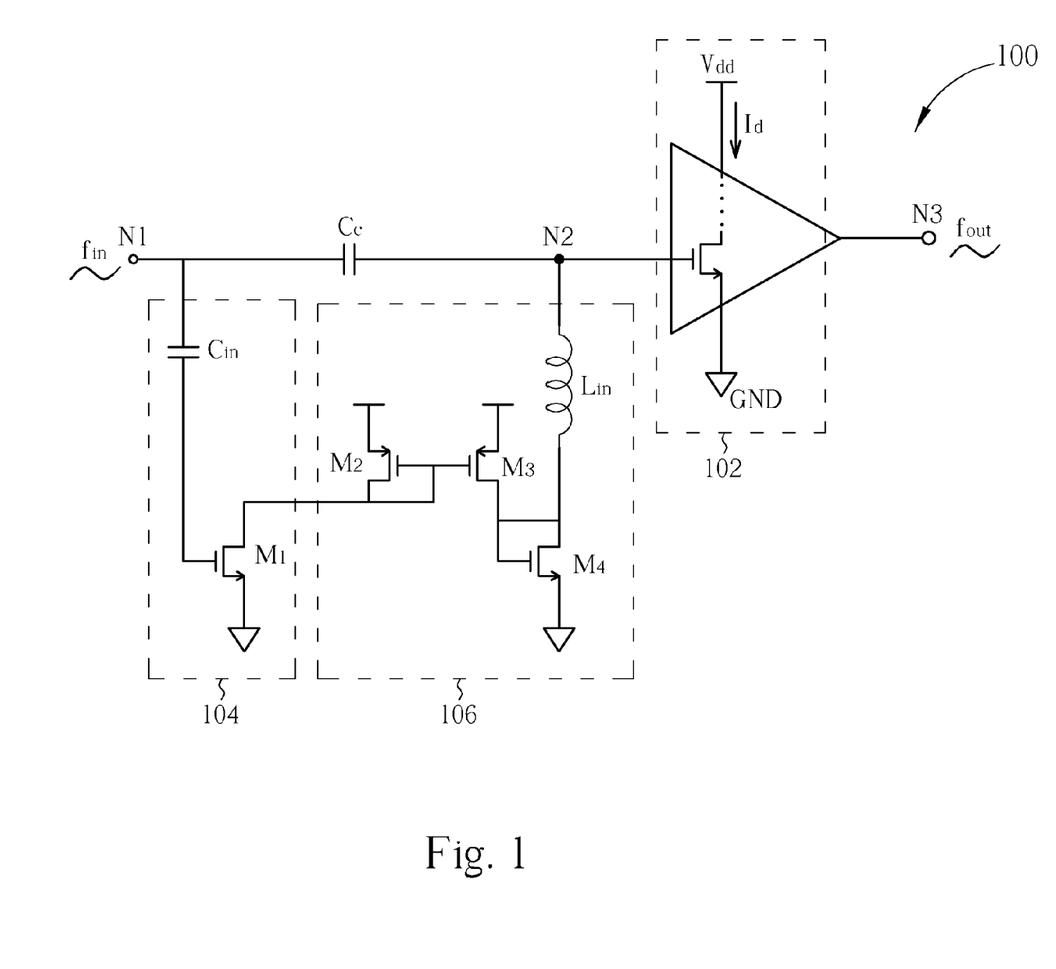
FIG. 1 is a diagram illustrating an adjustable gain power amplifier circuit according to a first embodiment of the present invention.

Please refer to FIG. 1. FIG. 1 is a diagram illustrating an adjustable gain power amplifier circuit 100 according to a first embodiment of the present invention. The power amplifier circuit 100 includes a power amplifying unit 102, a power detecting unit 104, and a biasing control unit 106. The power detecting unit 104 is coupled to an input signal $f_{in}$, and the biasing control unit 106 is coupled to the power detecting unit 104 and an input terminal N2 of the power amplifying unit 102. The power amplifier circuit 100 further includes a capacitor $C_c$ coupled between an input terminal N1 of the power amplifier circuit 100 and the power amplifying unit 102. The power amplifying unit 102 performs power amplifying of the input signal $f_{in}$ that is received at the input terminal N2 and outputs an output signal $f_{out}$ at the output terminal N3 (which is the output terminal of the power amplifier circuit 100). The power detecting unit 104 is utilized for detecting the power of the input signal $f_{in}$ to generate a detecting signal. The biasing control unit 106 is utilized for generating a biasing signal according to the detecting signal, and outputting the biasing signal to the input terminal N2 of the power amplifying unit 102.

According to the embodiment shown in FIG. 1, the input terminal N2 of the power amplifying unit 102 is coupled to the gate terminal of an internal N-type transistor of the power amplifying unit 102. Furthermore, the power amplifying unit 102 consists of a predetermined voltage source $V_{dd}$ (fixed DC biasing current) and a ground terminal GND. Therefore, the DC biasing current at the input terminal N2 will decide the operating gain of the power amplifying unit 102. The power detecting unit 104 includes a capacitor $C_{in}$ coupled to the input terminal N1, and the other terminal of the capacitor $C_{in}$ is coupled to the gate terminal of a N-type transistor M1. In order to precisely detect the power of the input signal $f_{in}$, the gate terminal of the N-type transistor M1 of the power amplifier circuit 100 is biased at the pinch-off voltage. The biasing control unit 106 includes a current mirror that consists of two P-type transistors M2, M3, a diode connected N-type transistor M4, and an inductor $L_{in}$. Please note that, in another embodiment of the present invention, the power amplifier further consists of a matching circuit in order to match the impedance between the output terminal N3 of the power amplifying unit 102 and the matching circuit, which also belongs to the scope of the present invention.

When the input signal $f_{in}$ is inputted to the input terminal N1, the DC component of the input signal $f_{in}$ is eliminated by the capacitor $C_{in}$, and therefore only the AC component of the input signal $f_{in}$ is transmitted to the gate terminal of the N-type transistor M1. Therefore, only a half-wave of the AC component of the input signal $f_{in}$ is amplified and outputted as the current signal at the drain terminal of the N-type transistor M1. Meanwhile, the current mirror that consists of the P-type transistors M2, M3 couples the half-wave current signal to the N-type transistor M4. Then, the N-type transistor M4 provides a DC biasing current to the input terminal N2 of the power amplifying unit 102 through the inductor $L_{in}$ according to the half-wave current signal. Accordingly, when the power of the input signal $f_{in}$ is larger (the amplitude of the input signal $f_{in}$ is larger), the DC biasing current is also higher, consequently resulting in the power amplifying unit 102 having a larger DC current $I_d$. In addition, smaller input signal $f_{in}$ results in smaller DC current $I_d$. Please note that the inductor $L_{in}$ is only an example of an impedance device in this embodiment, and is not meant to be a limitation of the present invention. In other words, the inductor $L_{in}$ in this embodiment can also be replaced by other devices, such as a resistor.

Figure 2:
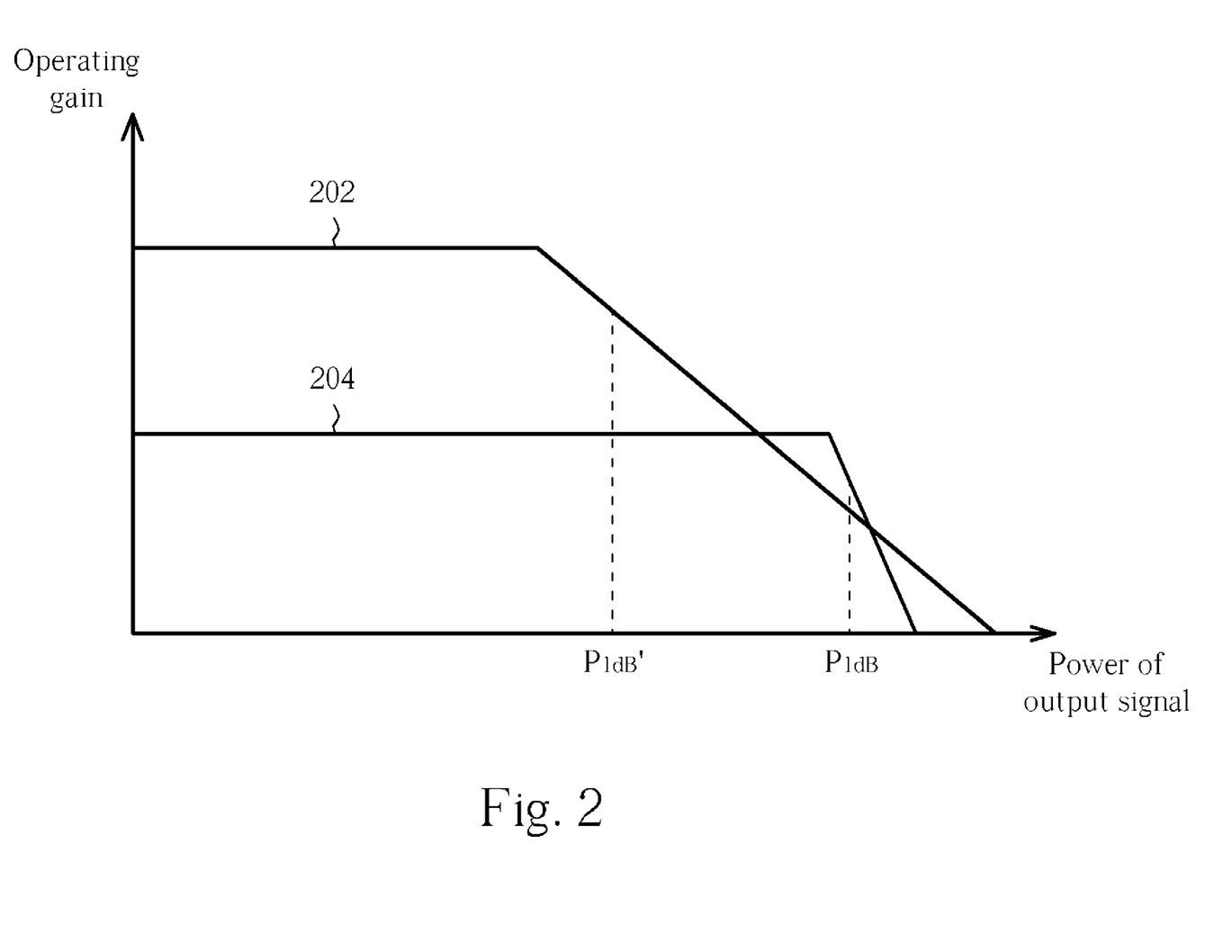
FIG. 2 is a diagram illustrating the relationship between the power of the output signal and the operating gain of the power amplifying unit in FIG. 1.

Please refer to FIG. 2. FIG. 2 is a diagram illustrating the relationship between the power of the output signal $f_{out}$ and the operating gain of the power amplifying unit 102 in FIG. 1, where the characteristic curve 202 is the operating curve of the prior art power amplifier, and the characteristic curve 204 is the operating curve of the power amplifying unit 102. As shown in the characteristic curve 202 of FIG. 2, the operating power is inversely proportional to the operating gain. In other words, when the operating power increases, the operating gain will decrease. Furthermore, when the operating gain drops to 1 dB, the prior art power amplifier outputs the output power of $P_{1dB}'$. Please refer to the embodiment shown in FIG. 1 again. When the input signal $f_{in}$ is low power, the operating gain of the power amplifying unit 102 that drops to 1 dB will have a higher output power $P_{1dB}$ than the output power $P_{1dB}'$. Consequently, when the operating gain of the power amplifying unit 102 decreases, the power amplifying unit 102 will equivalently increase the output power of $P_{1dB}$ (as shown by the characteristic curve 204).

Figure 3:
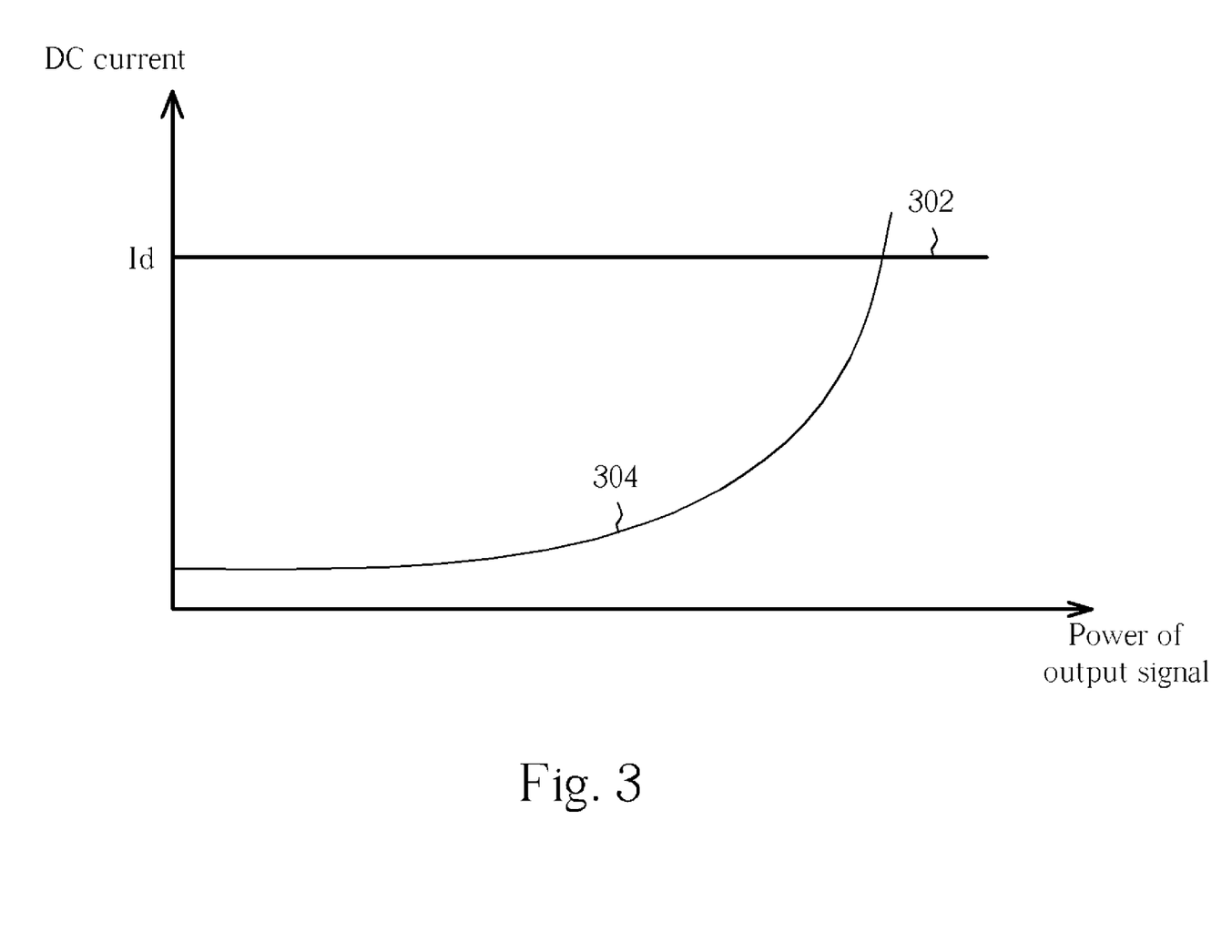
FIG. 3 is a diagram illustrating the relationship between the power of the output signal and the DC current of the power amplifying unit in FIG. 1.

Please refer to FIG. 3. FIG. 3 is a diagram illustrating the relationship between the power of the output signal $f_{out}$ and the DC current $I_d$ of the power amplifying unit 102 in FIG. 1. In FIG. 3, the characteristic curve 302 shows that no matter how large the power of the output signal $f_{out}$, the DC current $I_d$ remains the same; therefore some DC current is wasted when the power of the output signal $f_{out}$ is small. The characteristic curve 304 shows that the DC current changes with the power of the output power, where when the output power is small, the DC current is also small. Accordingly, the adjustable gain power amplifier circuit 100 of the present invention is able to dynamically adjust the operating gain of the power amplifying unit 102 according to the power of the input signal $f_{in}$ in order to obtain the highest $P_{1dB}$ power and the optimal power efficiency.

Figure 4:
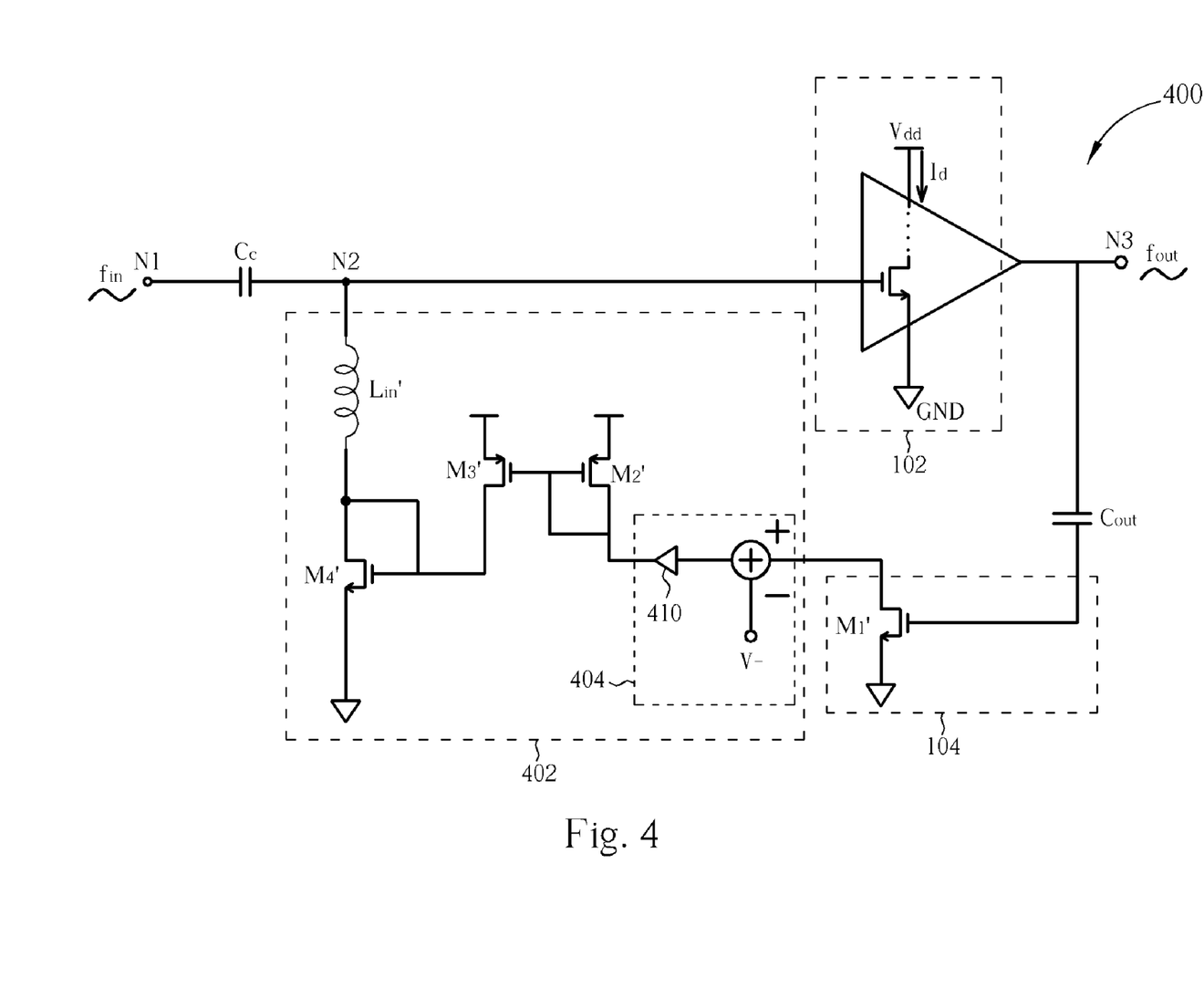
FIG. 4 is a diagram illustrating a second embodiment of an adjustable gain power amplifier circuit according to the present invention.

Please refer to FIG. 4. FIG. 4 is a diagram illustrating a second embodiment of an adjustable gain power amplifier circuit 400 according to the present invention. The power amplifier circuit 400 includes a power amplifying unit 102 (having the predetermined voltage source $V_{dd}$), a power detecting unit 104, and a biasing control unit 402. The power detecting unit 104 is coupled to an output signal $f_{out}$, and the biasing control unit 402 is coupled between the power detecting unit 104 and an input terminal N2 of the power amplifying unit 102. Compared with the biasing control unit 106 in FIG. 1, the biasing control unit 402 further includes a power level adjusting unit 404. The power amplifier circuit 400 further includes a capacitor $C_c$, coupled between an input terminal N1 of the power amplifier circuit 400 and the power amplifying unit 102, for eliminating the DC component of the input signal $f_{in}$; and a capacitor $C_{out}$, coupled to an output terminal N3 of the power amplifying unit 102 (the output terminal of the power amplifier circuit 400), for eliminating the DC component of the output signal $f_{out}$. The power amplifying unit 102 performs power amplifying on the input signal $f_{in}$ that is received at the input terminal N2 and outputs an output signal $f_{out}$. The power detecting unit 104 is utilized for detecting the power of the output signal $f_{out}$ to generate a detecting signal. The biasing control unit 402 is utilized for generating a biasing signal according to the detecting signal, and outputting the biasing signal to the input terminal N2 of the power amplifying unit 102. In FIG. 4, the power level adjusting unit 404 includes a first input terminal coupled to the power detecting unit 104, and a second input terminal coupled to an level adjusting voltage V−. The detecting signal outputted from the power detecting unit 104 is adjusted by the level adjusting voltage V−, and then inputted to a buffering unit 410. The buffering unit 410 receives the adjusted detecting signal that is outputted from the power level adjusting unit 404. Furthermore, the buffering unit 410 is coupled to the current mirror of the biasing control unit 402. Please note that, in another embodiment of the present invention, the power amplifier further consists of a matching circuit in order to match the impedance between the output terminal N3 of the power amplifying unit 102 and the matching circuit, and this also belongs to the spirit of the present invention.

When the input signal $f_{in}$ is inputted to the input terminal N1, the DC component of the input signal $f_{in}$ is eliminated by the capacitor $C_c$, and therefore only the AC component of the input signal $f_{in}$ is transmitted to the gate terminal of the N-type transistor M1 of the power amplifying unit 102. Then, the power amplifying unit 102 amplifies the input signal $f_{in}$ and outputs an output signal $f_{out}$ at the output terminal N3. The DC component of the output signal $f_{out}$ is eliminated by the capacitor $C_{out}$, and couples the AC component of the output signal $f_{out}$ to the gate terminal of the N-type transistor M1'. Then, the AC component of the output signal $f_{out}$ is amplified and outputted at the drain terminal of the N-type transistor M1' to generate the haft-wave current signal. Because the power of the half-wave current signal is higher and not able to be directly coupled to the current mirror of the biasing control unit 402, the power level adjusting unit 404 adjusts the power of the detecting signal that is outputted from the power detecting unit 104 into the level adjusting voltage V−. At the same time, the half-wave current signal that is power adjusted by the current mirror consisting of the two P-type transistors M2', M3' is coupled to a diode connected N-type transistor M4'. Finally, the N-type transistor M4' provides a DC biasing current to the input terminal N2 of the power amplifying unit 102 through the inductor $L_{in}$' according to the half-wave current signal. Accordingly, when the power of the input signal $f_{in}$ is larger (the amplitude of the input signal $f_{in}$ is larger), the DC biasing current is also higher, and which consequently resulting in the power amplifying unit 102 having a larger DC current $I_d$; and the converse is also true—when the power of the input signal $f_{in}$ is smaller, the DC current $I_d$ is also smaller. Furthermore, the relationship between the power of the output signal $f_{out}$ and the operating gain of the power amplifier circuit 400, and the relationship between the power of the output signal $f_{out}$ and the DC current $I_d$ of the power amplifier circuit 400 are respectively similar to that shown in FIG. 2 and FIG. 3 of the first embodiment. Please note that the inductor $L_{in}$' is only an example of an impedance device in this embodiment, and not a limitation to the present invention. In other words, the inductor $L_{in}$' in this embodiment can also be replaced by other devices, such as a resistor.

Figure 5:
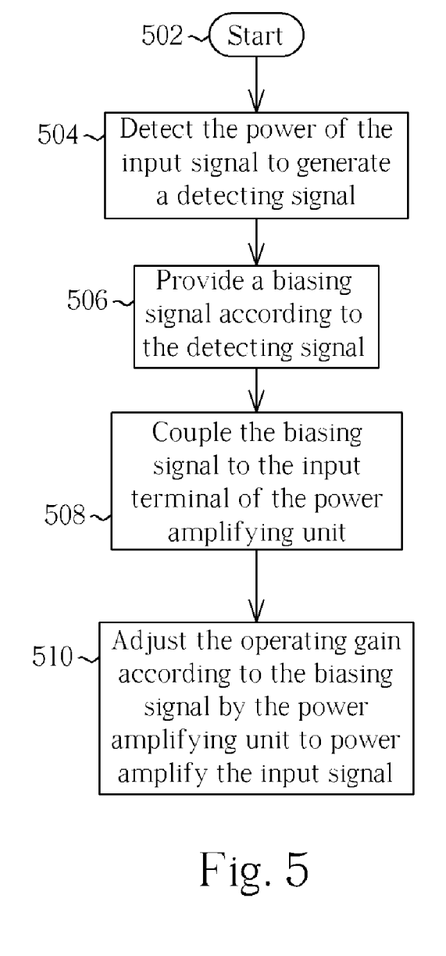
FIG. 5 is a flowchart illustrating a method corresponding to the first embodiment for adjusting the gain of the power amplifying unit of the first embodiment.

In another embodiment of the present invention, the power detecting unit 104 can be an envelope detector. Please refer to FIG. 5. FIG. 5 is a flowchart illustrating a method corresponding to the first embodiment for adjusting the gain of the power amplifying unit. The power amplifying unit is able to power amplify an input signal received at an input terminal in order to generate an output signal. The method includes the following steps:

Step 502: Start;
Step 504: Detect the power of the input signal to generate a detecting signal;
Step 506: Provide a biasing signal according to the detecting signal;
Step 508: Couple the biasing signal to the input terminal of the power amplifying unit; and
Step 510: Adjust the operating gain according to the biasing signal by the power amplifying unit to power amplify the input signal.

In step 510, when the power of the input signal is larger (the amplitude of the input signal is larger), the DC biasing current is also higher, consequently resulting in the power amplifying unit having a larger DC current $I_d$; and vice versa. Accordingly, this method will increase the output power of $P_{1dB}$ and the power efficiency of the power amplifying unit.

Figure 6:
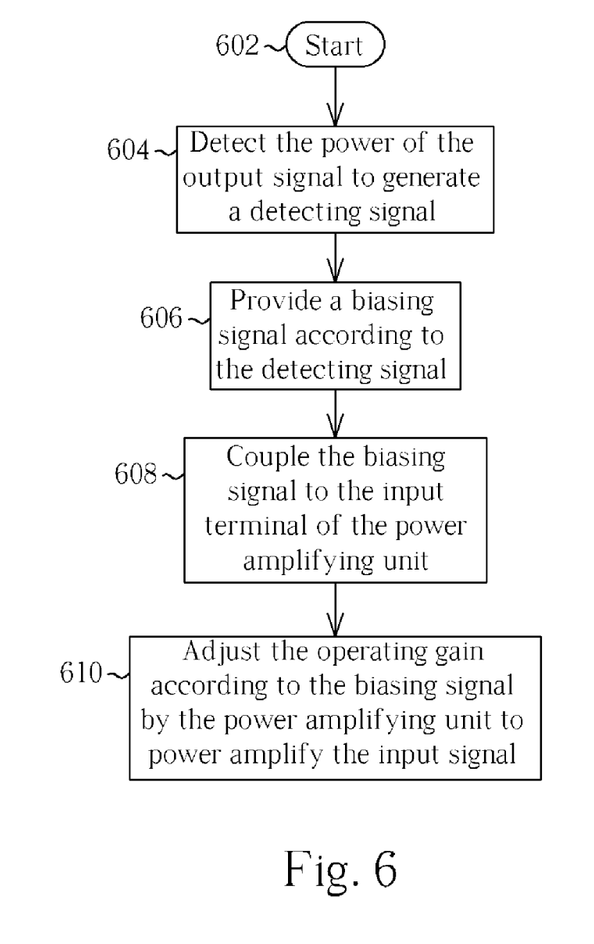
FIG. 6 is a flowchart illustrating a method corresponding to the second embodiment for adjusting the gain of the power amplifying unit of the second embodiment.

Please refer to FIG. 6. FIG. 6 is a flowchart illustrating a method corresponding to the second embodiment for adjusting the gain of the power amplifying unit. The power amplifying unit is able to power amplify an input signal received at an input terminal in order to generate an output signal. The method includes the following steps:

Step 602: Start;
Step 604: Detect the power of the output signal to generate a detecting signal;
Step 606: Provide a biasing signal according to the detecting signal;
Step 608: Couple the biasing signal to the input terminal of the power amplifying unit; and
Step 610: Adjust the operating gain according to the biasing signal by the power amplifying unit to power amplify the input signal.

In step 610, when the power of the input signal is larger (the amplitude of the input signal is larger), the DC biasing current is also higher, consequently resulting in the power amplifying unit having a larger DC current $I_d$; and vice versa. Accordingly, this method will increase the output power of $P_{1dB}$ and the power efficiency of the power amplifying unit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An adjustable gain power amplifier circuit, comprising:
   a power amplifying unit, for receiving an input signal and amplifying the input signal to generate an output signal;
   a power detecting unit, for detecting power of the input signal to generate a detecting signal, wherein the power detecting unit comprises:
      a capacitor, having a first terminal coupled to an input terminal of the power amplifying unit, for eliminating a DC component of the input signal to generate an AC component of the input signal; and
      a first transistor, having a gate terminal coupled to a second terminal of the capacitor, for amplifying the AC component of the input signal to generate the detecting signal; and
   a biasing control unit, for generating a biasing signal according to the detecting signal and outputting the biasing signal.

2. The power amplifier circuit of claim 1, wherein the biasing control unit comprises:
   two transistors configured to act as a current mirror;
   a diode-connected transistor, coupled to the current mirror; and
   an inductor, having a terminal directly connected to a drain terminal of the diode-connected transistor.

3. The power amplifier circuit of claim 1, wherein the biasing control unit outputs the biasing signal to an input terminal of the power amplifying unit, the biasing control unit comprises:
   two transistors configured to act as a current mirror;
   a diode-connected transistor, coupled to the current mirror; and
   a resistor, having a first terminal coupled to a drain terminal of the diode-connected transistor and a second terminal outputting the biasing signal.

4. The power amplifier circuit of claim 1, wherein the biasing control unit outputs the biasing signal to the power amplifying unit.

5. The power amplifier circuit of claim 1, wherein the power detecting unit is an envelope detector.

6. The power amplifier circuit of claim 1, further comprising a matching device, for matching the power amplifying unit.

7. An adjustable gain power amplifier circuit, comprising:
   a power amplifying unit, for receiving an input signal and amplifying the input signal to generate an output signal;
   a power detecting unit, coupled to an output terminal of the power amplifying unit, for detecting power of the output signal to generate a detecting signal; and
   a biasing control unit, coupled to an input terminal of the power amplifying unit, for generating a biasing signal according to the detecting signal and outputting the biasing signal to the input terminal of the power amplifying unit;
   wherein the biasing control unit comprises:
   a power level adjusting unit, coupled to the power detecting unit, for adjusting the detecting signal to generate an adjusted detecting signal;
   a buffering unit, coupled to the power level adjusting unit, for receiving the adjusted detecting signal;

two transistors configured to act as a current mirror, having a first terminal coupled to the buffering unit;

a diode-connected transistor, having a gate terminal coupled to a second terminal of the current mirror; and an inductor, having a first terminal coupled to a drain terminal of the diode-connected transistor, and a second terminal outputted the biasing signal to the input terminal of the power amplifying unit.

8. The power amplifier circuit of claim 7, wherein the power detecting unit comprises:

a first transistor, having a gate terminal coupled to the output terminal of the power amplifying unit, and a drain terminal outputted the detecting signal.

9. The power amplifier circuit of claim 7, wherein the power detecting unit is an envelope detector.

10. The power amplifier circuit of claim 7, further comprising a matching device, for matching the power amplifying unit.

11. An adjustable gain power amplifier circuit, comprising:

a power amplifying unit, for receiving an input signal and amplifying the input signal to generate an output signal;

a power detecting unit, coupled to an output terminal of the power amplifying unit, for detecting power of the output signal to generate a detecting signal; and a biasing control unit, coupled to an input terminal of the power amplifying unit, for generating a biasing signal according to the detecting signal and outputting the biasing signal to the input terminal of the power amplifying unit;

wherein the biasing control unit comprises:

a power level adjusting unit, coupled to the power detecting unit, for adjusting the detecting signal to generate an adjusted detecting signal;

a buffering unit, coupled to the power level adjusting unit, for receiving the adjusted detecting signal;

two transistors configured to act as a current mirror, having a first terminal coupled to the buffering unit;

a diode-connected transistor, having a gate terminal coupled to a second terminal of the current mirror; and a resistor, having a first terminal coupled to a drain terminal of the diode-connected transistor, and a second terminal outputted the biasing signal to the input terminal of the power amplifying unit.

12. The power amplifier circuit of claim 11, wherein the power detecting unit comprises:

a first transistor, having a gate terminal coupled to the output terminal of the power amplifying unit, and a drain terminal outputted the detecting signal.

13. The power amplifier circuit of claim 11, wherein the power detecting unit is an envelope detector.

14. The power amplifier circuit of claim 11, further comprising a matching device, for matching the power amplifying unit.

* * * * *